United States Patent

Heinz et al.

(10) Patent No.: US 9,792,259 B2
(45) Date of Patent: Oct. 17, 2017

(54) SYSTEMS AND/OR METHODS FOR INTERACTIVE EXPLORATION OF DEPENDENCIES IN STREAMING DATA

(71) Applicant: Software AG, Darmstadt (DE)

(72) Inventors: Christoph Heinz, Weimar (DE); Rajmohan Krishnamurthy, Walnut Creek, CA (US)

(73) Assignee: SOFTWARE AG, Darmstadt (DE)

(*) Notice: Subject to any disclaimer, the term of this patent is extended or adjusted under 35 U.S.C. 154(b) by 0 days.

(21) Appl. No.: 14/973,031

(22) Filed: Dec. 17, 2015

(65) Prior Publication Data

US 2017/0177546 A1    Jun. 22, 2017

(51) Int. Cl.

| G06F 17/30 | (2006.01) |
|---|---|
| G06F 17/18 | (2006.01) |
| G06F 3/0484 | (2013.01) |
| G06F 3/0482 | (2013.01) |
| G06T 11/20 | (2006.01) |
| G06F 17/50 | (2006.01) |

(52) U.S. Cl.
CPC .......... G06F 17/18 (2013.01); G06F 3/0482 (2013.01); G06F 3/04842 (2013.01); G06F 17/30516 (2013.01); G06F 17/5009 (2013.01); G06T 11/206 (2013.01)

(58) Field of Classification Search
CPC ......... G06F 17/30516; G06F 17/30539; G06F 17/30551; G06F 17/30398; G06F 17/30958; G06F 17/30294
USPC ................................................ 707/102, 719
See application file for complete search history.

(56) References Cited

U.S. PATENT DOCUMENTS

| 4,344,142 A | 8/1982 | Diehr |
|---|---|---|
| 6,732,064 B1 | 5/2004 | Kadtke et al. |
| 7,333,923 B1 | 2/2008 | Yamanishi |
| 7,783,744 B2 | 8/2010 | Garg et al. |
| 7,974,896 B2 | 7/2011 | Busse et al. |
| 8,266,351 B2 | 9/2012 | Schoening et al. |
| 8,610,718 B2 | 12/2013 | Suntinger et al. |
| 8,640,089 B2 | 1/2014 | Bates et al. |
| 8,839,133 B2 | 9/2014 | Abeln et al. |
| 8,972,462 B2 | 3/2015 | Naim et al. |
| 8,977,600 B2 | 3/2015 | Crupi et al. |
| 9,286,345 B2 | 3/2016 | Bandholz |
| 2002/0059151 A1 | 5/2002 | Soufian et al. |
| 2003/0130967 A1 | 7/2003 | Mannila |
| 2005/0251532 A1 | 11/2005 | Radhakrishnan |

(Continued)

OTHER PUBLICATIONS

Chetan Gupta et al., "Chaos: A Data Stream Analysis Architecture for Enterprise Applications," CEC, 2009 IEEE Conference on Commerce and Enterprise Computing, 9 pages.

(Continued)

*Primary Examiner* — Srirama Channavajjala
*Assistant Examiner* — Jessica N Le
(74) *Attorney, Agent, or Firm* — Nixon & Vanderhye PC

(57) ABSTRACT

Certain example embodiments allow for the continuous discovery and analysis of dependencies in a multidimensional event stream in which various regression models are continuously modified in real time and regression models are switched, if necessary or desirable. The event streams in certain example embodiments are continuously arriving Big Data streams of heterogeneous types, and the discovery and analysis is done dynamically in real time.

30 Claims, 8 Drawing Sheets

(56) References Cited

U.S. PATENT DOCUMENTS

| | | |
|---|---|---|
| 2006/0140497 A1 | 6/2006 | Kondo |
| 2006/0217939 A1 | 9/2006 | Nakata |
| 2007/0136239 A1 | 6/2007 | Lee et al. |
| 2007/0226175 A1 | 9/2007 | Resnic et al. |
| 2008/0013784 A1 | 1/2008 | Takeshima et al. |
| 2008/0043871 A1 | 2/2008 | Latouche |
| 2008/0071904 A1 | 3/2008 | Schuba et al. |
| 2008/0109731 A1 | 5/2008 | Chang et al. |
| 2008/0186225 A1 | 8/2008 | Didler |
| 2009/0024622 A1 | 1/2009 | Chkodrov et al. |
| 2009/0030926 A1* | 1/2009 | Aharoni ............ G06F 17/30516 |
| 2009/0060353 A1 | 3/2009 | Saisan et al. |
| 2009/0086755 A1 | 4/2009 | Chen et al. |
| 2009/0222472 A1 | 9/2009 | Aggarwal et al. |
| 2009/0228499 A1* | 9/2009 | Schmidtler .......... G06N 99/005 |
| 2009/0265336 A1 | 10/2009 | Suntinger et al. |
| 2010/0061251 A1 | 3/2010 | Nassor et al. |
| 2010/0095232 A1* | 4/2010 | Ramsay ................. G06F 17/18 715/769 |
| 2010/0131543 A1 | 5/2010 | Chkodrov et al. |
| 2011/0029463 A1 | 2/2011 | Forman et al. |
| 2011/0095885 A9 | 4/2011 | Nielsen et al. |
| 2011/0196647 A1 | 8/2011 | Perala et al. |
| 2011/0239229 A1 | 9/2011 | Meijer et al. |
| 2012/0062641 A1 | 3/2012 | Dejong |
| 2012/0089626 A1 | 4/2012 | Goranson |
| 2012/0115522 A1 | 5/2012 | Nama et al. |
| 2012/0158360 A1* | 6/2012 | Cammert .......... G06F 17/30516 702/179 |
| 2012/0195375 A1 | 8/2012 | Wuebbolt |
| 2013/0046725 A1 | 2/2013 | Cammert et al. |
| 2013/0191370 A1* | 7/2013 | Chen ................. G06F 17/30463 707/718 |
| 2014/0025700 A1 | 1/2014 | Schöning |
| 2014/0078163 A1 | 3/2014 | Cammert et al. |
| 2014/0351233 A1* | 11/2014 | Crupi ................. G06F 17/30516 707/706 |
| 2015/0269228 A1* | 9/2015 | Fisher ................ G06F 17/30516 707/722 |
| 2015/0293954 A1* | 10/2015 | Hsiao ................ G06F 17/30516 715/738 |
| 2015/0332157 A1* | 11/2015 | Baughman ............ G06N 99/005 706/52 |

OTHER PUBLICATIONS

Ling Xiao et al., "Enhancing Visual Analysis of Network Traffic Using Knowledge Representation," retrieved Dec. 17, 2015, 8 pages.

Michael Behrisch et al., "Feedback-Driven Interactive Exploration of Large Multidimensional Data Supported by Visual Classifier," retrieved Dec. 17, 2015, 10 pages.

Zhicheng Liu et al., "imMens: Real-Time Visual Querying of Big Data," retrieved Dec. 17, 2015, 10 pages.

Sye-Min Chan et al., "Maintaining Interactivity While Exploring Massive Time Series," Oct. 21, 2008, IEEE Symposium on Visual Analytics Science and Technology, 8 pages.

Scott Barlowe et al., Multivariate Visual explanation for High Dimensional Datasets, retrieved Dec. 17, 2015, 8 pages.

Fabian Fischer et al., NStreamAware: Real-Time Visual Analytics for Data Streams (VAST Challenge 2014 MC3), retrieved Dec. 17, 2015, 2 pages.

Fabian Fischer et al., NStreamAware: Real-Time Visual Analytics for Data Streams to Enhance Situational Awareness, retrieved Dec. 17, 2015, 2 pages.

Jaegul Choo et al., "PIVE: Per-Iteration Visualization Environment for Supporting Real-time Interactions with Computational Methods,"retrieved Dec. 17, 2015, 2 pages.

Gloria Chatzopoulou et al., "Query Recommendations for Interactive Database Exploration," retrieved Dec. 17, 2015, 16 pages.

Ugur Cetintemel et al., "Query Steering for Interactive Data Exploration," retrieved Dec. 17, 2015, 4 pages.

Fabian Fischer et al., "Real-Time Visual Analytics for Event Data Streams," retrieved Dec. 17, 2015, 6 pages.

Yu-Hsuan Chan et al., "Regression Cube: A Technique for Multi-dimensional Visual Exploration and Interactive Pattern Finding," ACM Transactions on Interactive Intelligent Systems, vol. 4, No. 1. Article 7. Mar. 2014, 32 pages.

Ashok Gangwani et al., "Visual Analytics for Smart Data," RDIAS Journal of Information and Computer Application (RJITCA), retrieved Dec. 17, 2015, 4 pages.

Peter Bodensinsky et al., "Visual Process Mining: Event Data Exploration and Analysis," retrieved Dec. 17, 2015, 2 pages.

Thomas Mühlbacher et al., "A Partition-Based Framework for Building and Validating Regression Models," retrieved Dec. 17, 2015, 10 pages.

Chad A. Steed et al., "A Visual Analytics Approach for Correlation, Classification, and Regression Analysis," retrieved Dec. 17, 2015, 30 pages.

Microsoft Azure—Tumbling Window (Azure Stream Analytics), Oct. 21, 2015, 3 pages. https://msdn.microsoft.com/en-us/library/azure/dn835055.aspx.

Probability Density Functions, 2010, 3 pages.

Silverman, Density Estimation for Statistics and Data Analysis, 1986, 22 pages.

Heinz, Density Estimation over Data Streams, 2007, 63 pages.

Christoph Heinz et al., "Cluster Kernels: Resource-Aware Kernel Density Estimators over Streaming Data," IEEE Transactions on Knowledge and Data Engineering, vol. 20, No. 7, Jul. 2006, pp. 880-893.

Sumantra R. Kundu et al., "An Architectural Framework for Accurate Characterization of Network Traffic," IEEE Transactions on Parallel and Distributed Systems, vol. 20, No. 1, Jan. 2009, pp. 111-123.

Business Activity Monitoring mit Stream Mining am Fallbeispiel TeamBank AG, Christoph Heinz, Torsten Greiner, HMD: Praxis der Wirtschaftsinformatik Heft 268.

Detecting Stream Events in Distributed Streams, Jiajia Miao, Zhuxi Zhang, Zhijian Yuan, Yan Jia, Quanyuan Wu, 2008 Second International Conference on Future Generation Communication and Networking Symposia.

Online anomaly detection using KDE, T. Ahmed, GLOBECOM 2009.

Probability Density Estimation over evolving data streams using Tilted Parzen Window, Hong Shen Xiao-Long Yan, ISCC 2008.

Distributed Deviation Detection in Sensor Networks, T. Palpanas, D. Papadopoulos, V. Kalogeraki, D. Gunopulos, ACM SIGMOD Record, vol. 32, Issue 4.

Online outlier detection in sensor data using non-parametric models, S. Subramaniam, T. Palpanas, D. Papadopoulos, V. Kalogeraki, D. Gunopulos, VLDB 2006.

Detecting distance-based outliers in stream of data, F. Angiulli, F. Fassetti, CIKM 2007.

Mining data streams under block evolution, V. Ganti, J. Gehrke, R. Ramakrishnan, ACM SIGKDD Explorations 2003.

Efficient Clustering-Based Outlier Detection Algorithm for Dynamic Data Stream, M. Elahi, L. Kun, W. Nisar, L. Xinjie, W. Hongan, FSKD 2008.

Spot: A System for Detecting Projected Outliers From High-dimensional Data Streams, J. Zhang, Q. Gao, H. Wang, ICDE 2008.

On Abnormality Detection in Spuriously Populated Data Streams, Charu C. Aggarwal, IBM T.J. Watson Research Center.

\* cited by examiner

```xml
<eda:Event xmlns:eda="http://namespaces.softwareag.com/EDA/Event">
  <eda:Header>
    <eda:Type>{http://namespaces.softwareag.com/EDA}LinearRegressionModel</eda:Type>
    <eda:Start>2015-01-01T14:37:23Z</eda:Start>
    <eda:End>2015-01-01T14:52:23Z</eda:End>
    <eda:Kind>Event</eda:Kind>
  </eda:Header>
  <eda:Body>
    <p1:LinearRegressionModel xmlns:p1="http://namespaces.softwareag.com/EDA">
      <p1:StreamID>IoTHub23</p1:StreamID>
      <p1:ResponseVariable>ApplicationResponseTime</p1:ResponseVariable>
      <p1:Predictor>CPUusage</p1:Predictor>
      <p1:Size>9357</p1:Size>
      <p1:Sum_Xi>5894.72</p1:Sum_Xi>
      <p1:Sum_Xj>23142.54</p1:Sum_Xj>
      <p1:Squared_Sum_Xi>35154.64</p1:Squared_Sum_Xi>
      <p1:Product_Sum_Xi_Xj>12147.35</p1:Product_Sum_Xi_Xj>
    </p1:LinearRegressionModel>
  </eda:Body>
</eda:Event>
```

FIG. 3

| StreamID | Response Variable | Predictor | Start | End | Size | Sum_Xi | Sum_Xj | Squared_Sum_Xi | Product_Sum_Xi_Xj |
|---|---|---|---|---|---|---|---|---|---|
| IoTHub23 | Application ResponseTime | CPUusage | 2015-01-01T14:00:00Z | 2015-01-01T14:15:00Z | 9357 | 5894.72 | 23142.54 | 35154.64 | 12147.35 |
| IoTHub23 | Application ResponseTime | MemoryUsage | 2015-01-01T14:00:00Z | 2015-01-01T14:15:00Z | 9357 | 7132.59 | 23142.54 | 4519.89 | 13987.09 |
| IoTHub17 | Datacenter energy usage | APIQueriesPer Minute | 2015-01-01T14:15:00Z | 2015-01-01T14:30:00Z | 419 | 6412 | 12874.71 | 121091 | 142460 |
| ... | | | | | | | | | |

| StreamID | Response Variable | Predictor | Start | End | Size | Sum_Xi | Sum_Xj | Squared_Sum_Xi | Product_Sum_Xi_Xj |
|---|---|---|---|---|---|---|---|---|---|
| IoTHub23 | Application ResponseTime | CPUusage | 2015-01-01T14:00:00Z | 2015-01-01T14:15:00Z | 9357 | 5894.72 | 23142.54 | 35154.64 | 12147.35 |
| IoTHub23 | Application ResponseTime | MemoryUsage | 2015-01-01T14:00:00Z | 2015-01-01T14:15:00Z | 9357 | 7132.59 | 23142.54 | 4519.89 | 13987.09 |
| IoTHub17 | Datacenter energy usage | APIQueriesPer Minute | 2015-01-01T14:15:00Z | 2015-01-01T14:30:00Z | 419 | 6412 | 12874.71 | 121091 | 142460 |

SYSTEMS AND/OR METHODS FOR INTERACTIVE EXPLORATION OF DEPENDENCIES IN STREAMING DATA

TECHNICAL FIELD

Certain example embodiments described herein relate to complex event processing (CEP) systems and/or methods. More particularly, certain example embodiments described herein relate to visual analytics techniques that aid in the interactive exploration of dependencies in streaming data, e.g., from sources of Big Data.

BACKGROUND AND SUMMARY

Today, companies have to deal with an ever-increasing flood of business-relevant data. Indeed, because of technological advances and high degrees of connectivity, more and more data is being produced on a daily basis. This phenomenon is spread across practically all industries.

Not only is the volume of data increasing, but the frequency with which it is produced also is increasing—along with its variety. This phenomenon relates to what some have termed Big Data. Although there are a number of different definitions of Big Data, those skilled in the art understand that it generally refers to datasets so large and/or complex that traditional data processing applications are inadequate.

The amount and complexity of data being generated increases even more with increases in number of devices, systems, and services being connected with each other, e.g., over the Internet. In this regard, the so-called Internet of Things (IoT) is increasing yet further the volumes of data being produced on a daily basis, as well as the variety of the produced data. The IoT refers generally to the interconnection of devices and services using the Internet. The number of connecting devices emitting information has increased rapidly and is expected to continue increasing significantly. The IoT thus involves the handling of huge, heterogeneous volumes of data.

Regardless of whether it arises in the IoT or another technology-driven environment, this data at least in theory may have a high value to businesses, as it may be a part of the foundation of value-added services that can be offered to the customer. For example, a production machine may be made to automatically order items it is running short of by continuously comparing the current item consumption with the remaining capacities, a smart home for older people may detect a collapse by evaluating pressure sensors in the carpet, the churn rate of cell phone customers can be reduced by sending them coupons as compensation for current connectivity problems, etc.

In such setup, e.g., with dynamically varying numbers of data sources providing high volumes of heterogeneous data, proper data analysis can be quite a challenging task. For example, such analyses are not linear sequences of steps leading to an a priori expected result. Instead, they tend to involve more iterative and interactive processes with different analysis methods applied to different subsets of the data. Oftentimes, more insights on the data are derived with each iteration.

In that context, visual analytics sometimes is a reasonable approach, as it can combine automated data analysis with visual analysis conducted by the user. The user interactively may, for example, explore the dataset by visually investigating the data for specific patterns and then run automated data analysis tasks over the data. This process may run in an iterative manner. While visual analytics is one use case, some systems can also programmatically refine the data without user interaction.

In many use cases, the data sources to be analyzed produce an amount of data at a frequency that generally is so high that it oftentimes is referred to as being a data stream. Stream processing typically follows the pattern of continuous queries, which may be thought of in some instances as being queries that execute for a potentially indefinite amount of time on data that is generated or changes very rapidly. Such data are called streams, and streams oftentimes comprise events. Such streams often exist in real-world scenarios, e.g., as temperature readings from sensors placed in warehouses or on trucks for logistics purposes, weather data, entrance control systems (where events are generated whenever a person enters or leaves, for instance), etc. Events may include attributes (also sometimes referred to as a payload) such as, for example, the value of temperature readings and metadata (sometimes referred to as a header or header data) such as, for example, creation date, validity period, and quality of the event. Some events may have a data portion and temporal information (e.g., plane LH123 has landed at 4:34 PM, sensor TF17 has reported a temperature of 27° Celsius at 4 PM, IoT device DAEV17 has reported 67% CPU usage at 9:11 AM, etc.). Possible events occurring in an environment typically are schematically described by so-called event types, which in some respects are somewhat comparable to table definitions in relational databases. It thus will be appreciated that event streams typically have a high data volume and a low inter-arrival rate for events, and an event stream typically will be a temporally ordered sequence of events having the same type.

This "Big Data in motion" is contrastable with "Big Data at rest." Traditional database and data warehouse technology is not always powerful enough and is not necessarily designed to deal with these amounts of data and/or data velocities. Thus, it may be necessary or desirable to extend the processing capabilities of companies so that their applications are able to support the real-time processing of event streams.

For example, given the continual arrival of new data, one cannot store all data and then run a post hoc analysis, as sometimes is possible (but not always guaranteed) with Big Data at rest. In contrast to such a post hoc analysis, streams may need to be, and/or provide benefits from being, analyzed in a real-time manner. A corresponding analytics approach may deal with the volatile, streaming nature of incoming data streams by offering a continuous exploration of the data. For the specific case of visual analytics mentioned above, while data streams in, the user can visually explore it and run automated analysis tasks to uncover hidden knowledge. It thus is desirable to make the visualization real-time capable and allow browsing through continuously updated data. It also will be desirable to make the analysis tasks real-time capable in the sense that the results are continuously updated with new data streaming in. These demanding processing requirements basically prohibit the use of standard visual analytics techniques, even assuming that data can be accessed multiple times.

Complex Event Processing (CEP) is an approach to handling some challenges associated with processing and analyzing huge amounts of data arriving with high frequencies. As will be appreciated from the above, in this context, the arriving data is classified as a data stream. By processing the incoming events in main memory using sophisticated online algorithms, CEP systems can cope with very high data volumes (e.g., in the range of hundreds of thousands events per second) being processed and analyzed appropriately. CEP systems are designed to receive multiple streams of data and/or events and analyze them in an incremental manner with very low (e.g., near-zero) latency. Events may be evaluated and aggregated to form derived (or complex) events (e.g., by an engine or so-called event processing agents). Event processing agents can be cascaded such that, for example, the output of one event processing agent can be the input of another event processing agent. In other words, while the data is streaming in, it may be analyzed on-the-fly, and corresponding analytical results may be forwarded to subsequent consumers. Therefore, a CEP system need not necessarily persist the data it is processing. This is advantageous because, as explained above, a data and/or event stream oftentimes is characterized by high volumes and high rates and cannot be persisted.

CEP in general thus may be thought of as a processing paradigm that describes the incremental, on-the-fly processing of event streams, typically in connection with continuous queries that are continuously evaluated over event streams. Moreover, CEP analysis techniques may include, for example, the ability to perform continuous queries, identify time-based relations between events by applying windowing (e.g., through XQuery or SQL), etc., with the aid of processing resources such as at least one processor and a memory. See, for example, U.S. Pat. Nos. 8,640,089 and 8,266,351, as well as U.S. Publication Nos. 2014/0078163, 2014/0025700, and 2013/0046725, the entire contents of each of which are hereby incorporated herein by reference.

With CEP technology, relevant data can be extracted in time so that business applications operating on top of that technology can present analysis results with minimum latency to the user. A CEP-supported application can be connected to several event sources that continuously produce events, and such events can be analyzed and condensed by CEP analysis logic. The analysis results can be rendered for the business user (i.e., a user from a business unit, as opposed to a user from the entity's IT department, who is able to leverage dedicated business user applications that present business-relevant metrics) in a report, graphical user interface, and/or other medium.

One common analysis task involves detecting dependencies in data streams. Typically, data streams are multidimensional, i.e., they have multiple attributes. The dependencies between those attributes in this sense describe the relationship(s) the attributes have to one another. These relationships can constitute an important characteristic of the stream. For example, the probability of losing a cell phone customer because of connectivity problems has been found to have a strong negative relationship with the mobile Internet contingent offered for free; that is, the more free megabytes that are offered, the less likely it is that the customer will terminate the agreement.

Unfortunately, however, it is difficult to explore attribute dependencies in streaming data in an interactive manner, e.g., because of the amount of data involved, its continuous arrival, and its potentially dynamically variable type.

Certain example embodiments address the above and/or other concerns. For instance, certain example embodiments relate to techniques that enable the dependency structures of multidimensional data streams to be explored, e.g., even for Big Data in motion. In this regard, certain example embodiments allow a user to explore data streams and run analytic tasks over them, e.g., in order to reveal dependency structures within the data. Certain example embodiments employ a multi-functional Stream Dependency Explorer (SDE) for these and/or other purposes, e.g., as described in more detail below.

One aspect of certain example embodiments relates to statistical modeling of attribute dependencies. Given a multidimensional data stream, certain example embodiments use regression models to determine dependency structures hidden in the data. For the different pairs of attributes, certain example embodiments may compute the regression functions to build a statistical model of those dependencies. Certain example embodiments also may be used to analyze dependencies between attributes from different streams. In this regard, certain example embodiments may derive those dependency models for subsets of the stream and compare those models with the ones being computed for the complete stream. By doing so, certain example embodiments can detect changing dependency structures in the subset. To cope with the volatile nature of data streams, the regression functions may be computed with respect to different timeframes, e.g., in order to support the investigation of short-term and long-term developments of the data.

Another aspect of certain example embodiments relates to visualization of attribute dependencies. For the specific case of a visual analysis, certain example embodiments enable the user to select one of the attributes to enable the selected attribute to be continuously viewed, e.g., in a line chart or the like. Regression models may be computed for the selected attribute and the other attributes. In relation to (e.g., below) the plot of the selected attribute, the corresponding regression function may be displayed for each of the remaining attributes, which helps make visible the dependency between that attribute and the selected one in an intuitive manner. Plotting the regression functions for the remaining attributes may in some instances allow the user to directly grasp important dependencies between the selected and remaining attributes. The user in certain example embodiments also can select in the chart a subset of the stream, e.g., causing the regression function for the subset, as well as the regression function for the full set, to be automatically displayed. This approach may advantageously allow the user to easily detect changing dependency structures in the subset.

Another aspect of certain example embodiments relates to providing recommendations for exploration steps. Certain example embodiments may automatically highlight significant dependency structures so that the user is directed to the most important facts (or at least what are likely to be the most important facts). Additionally, or in the alternative, certain example embodiments may be configured to recommend to the user automatically detected, interesting subsets of the data, e.g., to provide reasonable starting points for further analysis. Besides that interactive approach, certain example embodiments also may be able to automatically compute regression models for successively refined subsets of the data, e.g., in order to help derive or otherwise reveal significant changes in dependency structures.

Another aspect of certain example embodiments relates to efficient online analysis of dependencies in streaming data. With data continuously streaming in, certain example embodiments provide the analytical results in an online manner. For that reason, the analytical tasks are implemented following the complex event processing (CEP) paradigm, which is designed for an online evaluation of massive data streams.

Another aspect of certain example embodiments relates to support for post hoc analysis of dependencies in streaming data. Besides the analysis of the current status of the stream, certain example embodiments may support a post hoc analysis over previous data. A history of the analytical results may be maintained so that, for example, current dependency structures can be compared with historical dependency structures.

In certain example embodiments, an information processing system is provided. An interface is configured to receive at least one selected stream of events from an event bus that receives a plurality of streams of events from a plurality of different devices, with each event in each stream in the plurality of streams having at least one attribute. A model store is backed by a non-transitory computer readable storage medium. Processing resources include at least one processor and a memory coupled thereto, and they are configured to at least: receive first user input identifying the at least one selected stream; receive second user input identifying at least two attributes of interest, with the attributes of interest being selected from the attributes of the events in the at least one selected stream; execute a continuous query on the at least one selected stream to attempt to, directly or indirectly, mathematically compute a statistical model including the at least two identified attributes of interest, the statistical model having a type; store a representation of the mathematically computed statistical model to the model store; generate for output to the user a user-interactive display including a representation of the mathematically computed statistical model, the user-interactive display being dynamically changeable based upon at least (a) an update to the mathematically computed statistical model that results from the execution of the continuous query, and (b) receipt of third user input that identifies a sub-stream of the at least one selected stream; determine whether the mathematically computed statistical model sufficiently fits for the at least two identified attributes of interest; and in response to a determination that the mathematically computed statistical model does not fit for the at least two identified attributes of interest, change the type of the statistical model to a new type so that the new type of statistical model better fits for the at least two identified attributes of interest.

In certain example embodiments, an information processing method is provided. The method comprises: using processing resources including at least one processor and a memory, receiving, over an electronic interface to an event bus that receives a plurality of streams of events from a plurality of different devices, at least one selected stream of events, each event in each stream in the plurality of streams having at least one attribute; receiving first user input identifying the at least one selected stream; receiving second user input identifying at least two attributes of interest, the attributes of interest being selected from the attributes of the events in the at least one selected stream; executing a continuous query on the at least one selected stream to attempt to, directly or indirectly, mathematically compute a statistical model including the at least two identified attributes of interest, the statistical model having a type; storing a representation of the mathematically computed statistical model to a model store that is backed by a non-transitory computer readable storage medium; generating, for output to the user, a user-interactive display including a representation of the mathematically computed statistical model, the user-interactive display being dynamically changeable based upon at least (a) an update to the mathematically computed statistical model that results from the execution of the continuous query, and (b) receipt of third user input that identifies a sub-stream of the at least one selected stream; determining whether the mathematically computed statistical model sufficiently fits for the at least two identified attributes of interest; and in response to a determination that the mathematically computed statistical model does not fit for the at least two identified attributes of interest, changing the type of the statistical model to a new type so that the new type of statistical model better fits for the at least two identified attributes of interest.

According to certain example embodiments, the at least two variables may correspond to one or more independent variables and one or more dependent variables.

According to certain example embodiments, the statistical model at least initially may be a linear regression model, and/or the new type of statistical model may be a non-linear regression model.

According to certain example embodiments, the representation of the mathematically computed statistical model may be stored to the model store at a predetermined interval and/or upon an occurrence of a predetermined event that has been automatically detected by the processing resources.

According to certain example embodiments, a historical model may be retrieved from the model store in response to a user selection, the retrieved historical model having an associated original temporal resolution; and the retrieved historical model may be applied with respect to the at least two identified attributes of interest at a temporal resolution that differs from the original temporal resolution associated with the retrieved historical model and/or against data currently streaming in from the at least one selected stream.

According to certain example embodiments, the first user input may identify a plurality of selected streams. The second user input may identify at least first and second attributes of interest, with the first attribute of interest being selected from the attributes of the events in one of the plurality of selected streams and with the second attribute of interest being selected from the attributes of the events in another one of the plurality of selected streams.

According to certain example embodiments, the user-interactive display may further include a dynamically updatable visual representation of a relationship between one or more of the at least two identified attributes of interest and at least one other, different attribute of the events in the at least one selected stream.

According to certain example embodiments, whether a highly correlated relationship exists between one or more of the at least two identified attributes of interest and each of the other, different attribute of the events in the at least one selected stream may be automatically detected; and the user-interactive display may be caused to highlight each automatically detected highly correlated relationship.

According to certain example embodiments, sub-streams of the at least one selected stream of potential interest may be automatically detected; and the user may be able to view such automatically detected sub-streams. A or the continuous query may be executed on a selected sub-stream to attempt to, directly or indirectly, mathematically compute another statistical model including the at least two identified attributes of interest within the selected sub-stream.

According to certain example embodiments, user input indicative of a replay request and a past time period associated with the replay request may be received; one or more historical models may be retrieved from the model store in response to the receipt of the user input indicative of the replay request, with the one or more retrieved historical models having been mathematically computed in a time period that accords with the past time period associated with the replay request; and a replay visually demonstrating how the one or more retrieved historical models developed over the past time period associated with the replay request may be generated for output.

Corresponding non-transitory computer readable storage mediums tangibly storing instructions for performing such methods also are provided by certain example embodiments, as are corresponding computer programs.

These features, aspects, advantages, and example embodiments may be used separately and/or applied in various combinations to achieve yet further embodiments of this invention.

BRIEF DESCRIPTION OF THE DRAWINGS

These and other features and advantages may be better and more completely understood by reference to the following detailed description of exemplary illustrative embodiments in conjunction with the drawings, of which:

FIG. 3 is an example event representation of the basic statistics of a linear regression model that may be produced using the techniques of certain example embodiments;

FIG. 5 is a schematic view of the regression model storage and example entries therein, in accordance with certain example embodiments;

DETAILED DESCRIPTION

Figure 1:
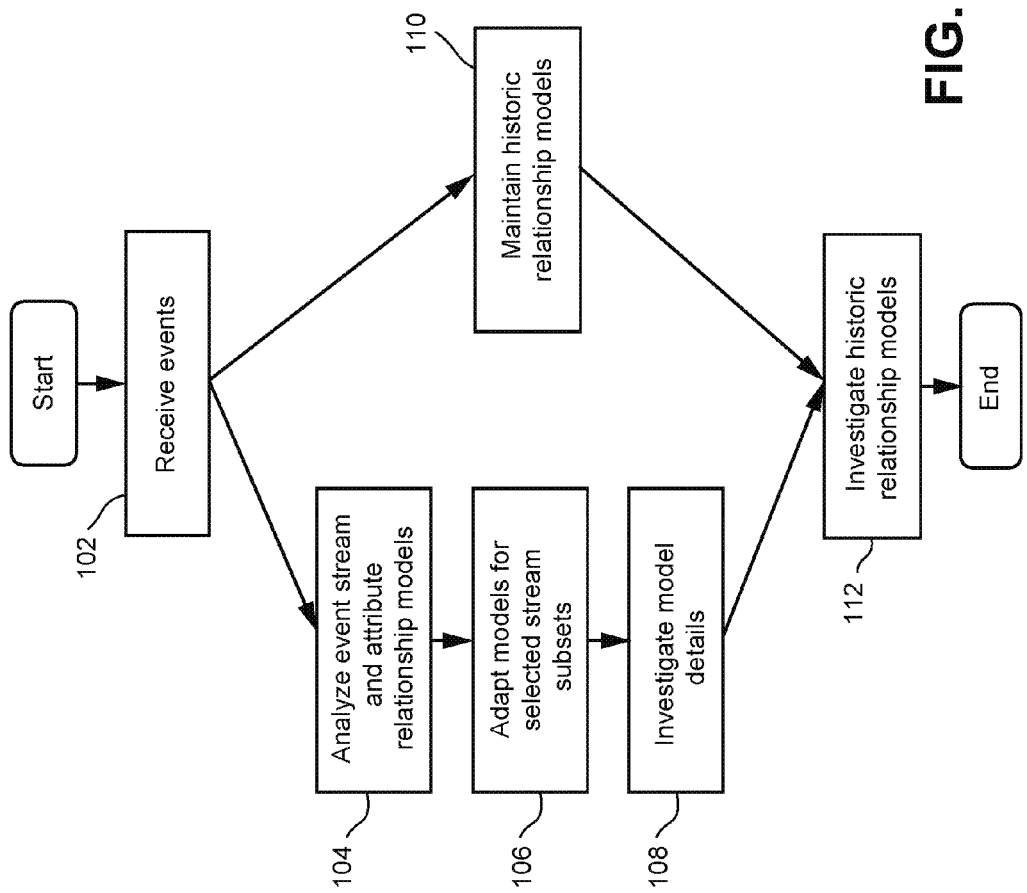
FIG. 1 is a flowchart demonstrating a basic workflow of the Stream Dependency Explorer of certain example embodiments.

Certain example embodiments relate to techniques that aid in the interactive exploration of dependencies in streaming data (including stream attributes in data streams), e.g., from sources of Big Data. In this regard, certain example embodiments provide for the continuous analysis of stream and attribute dependencies, continuous visualization of stream and attribute dependencies, investigation of attribute dependencies in sub-streams, post-hoc analysis of attribute dependencies.

With respect to the continuous analysis of stream and attribute dependencies, the Stream Dependency Explorer (SDE) of certain example embodiments allows the dependencies of attributes in a multidimensional event stream to be analyzed. To aid in this analysis, regression models are continuously computed in order to reveal the attribute dependencies hidden in the data.

Regression is a commonly used statistical technique that can help to determine relationships between attributes of a multidimensional dataset. The basic assumption is that the value of a dependent attribute is determined by one or more independent attributes. Regression can be used to estimate a regression function, which quantitatively describes that relationship. A commonly used technique is linear regression, which returns a linear function, assuming a linear relationship. Non-parametric regression techniques make fewer assumptions on the data, but generally require more data to provide reliable results.

Because of the continuous arrival of new data, the online computation and processing of regression models is more demanding than performing such an analysis over a static dataset. The SDE of certain example embodiments can be configured with different models and is not limited to any particular regression technique such as, for example, linear regression.

In order to cope with the volatile nature of event streams and to uncover their long-term and short-term tendencies, regression plots over different temporal windows may be made available in certain example embodiments. Certain example embodiments may continuously assess the quality of the regression models being computed and automatically switch to more suitable regression models if necessary or desirable (e.g., when a regression model fails to describe a relationship with a predetermined level of statistical significance indicating a poor fit, when linear regression cannot be performed, etc.). Some regression models operate on numeric attributes, but these or other models may be generated on different kinds of data (such as, for example, data defined as categorical variable types, binary variable types, interval ratio variable types, etc.). In this regard, certain example embodiments may automatically switch from parametric regression to non-parametric regression, from simple to more complex regression types, etc., in the event that a first model does not fit to the data in the data stream.

With respect to the continuous visualization of stream and attribute dependencies, certain example embodiments provide a user interface for visual data analysis. That interface allows the user to visually analyze the dependencies of attributes. The user may select an attribute of interest, causing that attribute to be made visual automatically using, for example, a line chart or the like. In relation to (e.g., below) the plot of the selected attribute, the corresponding regression function may be displayed for each of the remaining attributes, which helps make visual the dependency between that attribute and the selected one in an intuitive manner. Plotting the regression functions for the remaining attributes may in some instances allow the user to directly grasp important dependencies between the selected and remaining attributes. The displays may be automatically updated as new events stream in.

In order to facilitate investigation of attribute dependencies in sub-streams, when the user zooms into a subset of the stream, the regression models may be adapted to that subset. To allow for a comparison with the overall stream, the regression model canvas may plot or otherwise represent the subset models, as well as the overall model. Certain example embodiments may automatically derive or otherwise identify interesting subsets of the stream and recommend those subsets to the user in order to point to suspected interesting behavior of the stream. Certain example embodiments also may autonomously conduct the analysis of subsets of the stream in place of, or in addition to, the interactive exploration driven by the user. Thus, certain example embodiments make visual the regression analysis results for the complete set as well as a subset simultaneously, so that the user can investigate how dependency structures change in subsets.

Certain example embodiments also allow for post hoc analysis of attribute dependencies. For example, when the user has detected an interesting dependency in the current stream behavior, the user can examine whether that dependency was already present in the past. For that purpose, the system may maintain a history of regression models. The user can then compare those historic dependencies with current dependencies to allow for a comparison of recent and historic behavior. These historic models can be inspected on different temporal resolutions, e.g., to allow for a fine or coarse-grained assessment of the data. Additionally, for timeframes where the user did not visually inspect the stream, the user can use a replay function that helps to make visual the development of the regression models for that timeframe. These features may help the user to investigate the development of dependency structures over time allowing for, among other things, a comparison of recent and historic behavior.

Because certain example embodiments relate to analysis of streaming data including, for example, the investigation of dependency structures for high-volume, volatile data streams, certain example embodiments also allow for "online" computation of regression models, as well as an "online" visualization of those models. It thus would be desirable to make the displayed results easy and intuitive to consume by a human user, as the stream might rapidly change its behavior. Certain example embodiments therefore leverage visual analytics techniques which, as alluded to above, refer to a class of interactive data exploration techniques based on automated data analysis, as well as visual data analysis of the user. In certain example embodiments, the user is able to visually search in appropriate visualizations of the data for interesting information (such as, for example, patterns or outliers), and automated analysis techniques may be triggered to further refine, validate, refuse, or otherwise impact those results. Visual analytics typically is an interactive approach, with several feedback loops being involved in arriving at a final result.

Although not required, it may be beneficial to provide visual analytics over event streams that supports (a) interactive exploration such that the event stream can be interactively explored at any time and with new data being continuously added, (b) updatability in real time such that the view can incrementally append new events while keeping visualization complexity low (and potentially as low as possible), (c) locality where appending new events does not severely impact the overall visualization because the visualization is stable and, for instance, already visualized events are only changed if such a change is really needed, (d) preservation of temporal context such that even though the representation of the events may change, the temporal context remains stable, and/or (e) efficient access to historic results, which facilitates comparison of current with historic behavior by making analysis results for older timeframes efficiently accessed (such as, for example, by providing a manageable memory footprint and access cost).

FIG. 1 is a flowchart demonstrating a basic workflow of the Stream Dependency Explorer of certain example embodiments. As shown in FIG. 1, in step 102, events in a stream are received. In step 104, analysis is performed on the received events including, for example, an analysis that generates event stream and attribute relationship models. In step 106, the models are adapted for selected stream subsets, and the model details are investigated in step 108. As steps 104-108 are occurring, a store is updated in step 110 to help ensure that historical relationship models are maintained. The current and/or historical relationship models are investigated in step 112. Further details concerning how models are built, how models may be analyzed, etc., will become clearer from the example implementation provided below.

Example Implementation

An example implementation will now be provided. It will be appreciated, however, that other implementations (including the same or similar hardware and/or software configurations) may be used in different example embodiments. Thus, the following example implementation should not be seen as strictly limiting, unless expressly claimed.

Streams may in certain scenarios be organized in channels that in turn are implemented by an event bus. Channels and event types in this sense may be considered orthogonal concepts, e.g., in the sense that events of the same event type might be communicated via different channels. In some implementations, an event bus may be thought of as a central bus for all event streams within an Event-Driven Architecture (EDA), which may be used as the architecture underlying certain example embodiments. In general, an EDA is an architecture that captures the production and consumption of event streams and the reactions to those events. Components within an EDA may be designed to process events in an event-driven manner, e.g., directly when the event arrives. In this regard, in some scenarios, publishers can connect their streams to the bus so that the events are published on it, and subscribers can subscribe to the producer streams made available on the bus. Thus, events streaming in are directly processed and the results that follow are forwarded directly to the user interface so that the visualizations are always up-to-date. The online computation of results is based on the complex event processing (CEP) paradigm.

Figure 2:
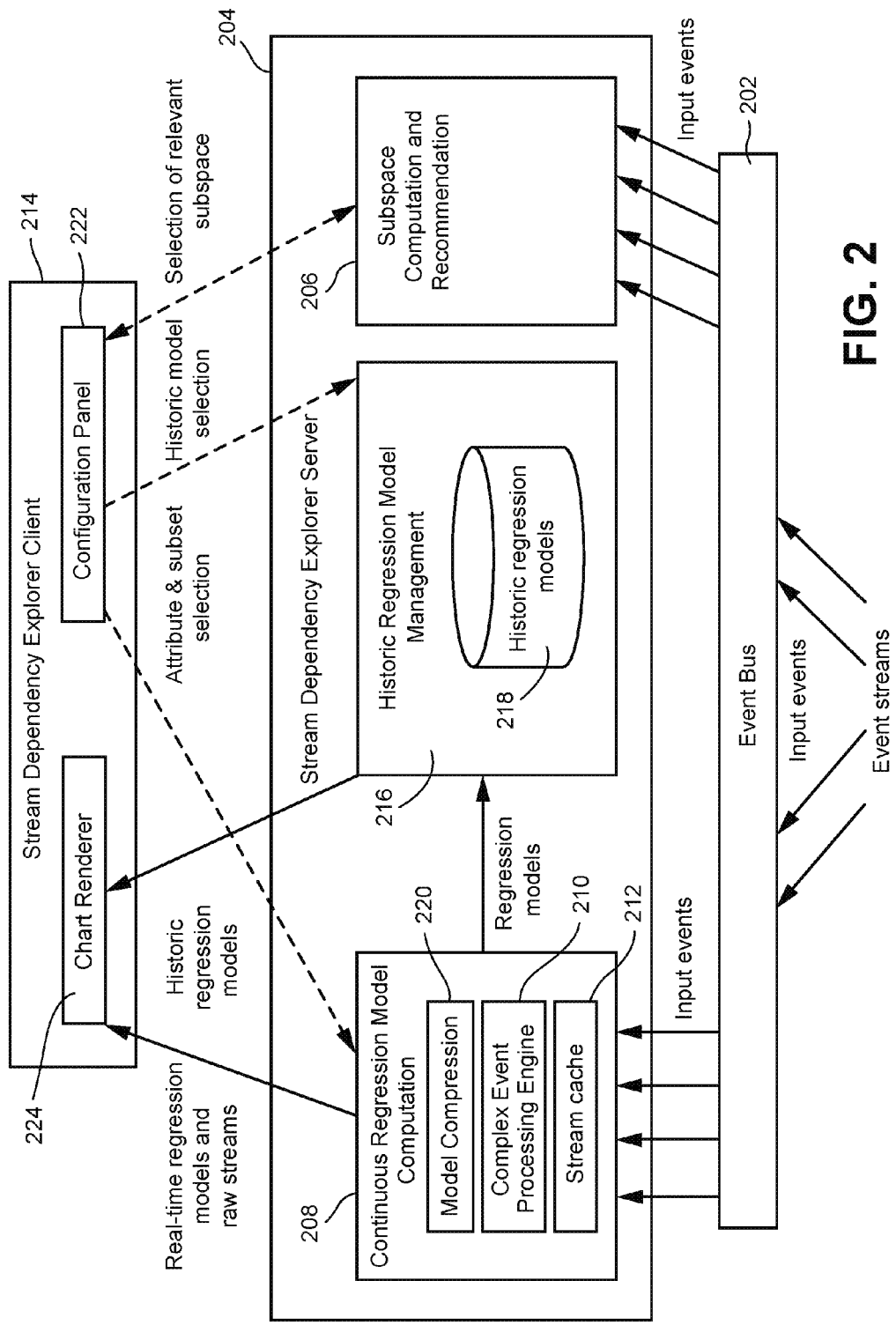
FIG. 2 is a block diagram showing components of an example SDE platform that may be used in accordance with certain example embodiments.

FIG. 2 is a block diagram showing components of an example SDE platform that may be used in accordance with certain example embodiments. The example architecture shown in and described in connection with FIG. 2 may underlie the example workflow shown in and described in connection with FIG. 1 and, for example, demonstrate the components and more detailed workflow information concerning how raw input events are transformed into reasonable results understandable by visual analytics or the like.

In FIG. 2, the solid arrowed lines refer to continuously flowing information such as, for example, events or regression models, and the dashed arrowed lines refer to configuration actions. Following the EDA approach described above, the event bus 202 is a transport channel to which all event streams are connected. The input event streams send their events to the event bus 202, which then forwards them to the SDE server 204. As indicated above, an input event stream typically provides events of a common type, and each event typically includes n attributes $x_1, \ldots, x_n$ and a timestamp $t_s$. The following discussion assumes real-valued attributes, i.e., $x_1, \ldots, x_n$ are real-valued numbers (although it will be appreciated that the attributes may be categorical variables, binary variables, and/or the like). In certain example embodiments, the event stream is connected as a publisher to the event bus 202, and its events are published on a dedicated channel of the event bus 202. The SDE server 204 in certain example embodiments is connected to the event bus 202 as a consumer. For all relevant input event streams, the SDE server 204 subscribes to the corresponding channels and directly receives corresponding events. The SDE server 204 may be backed by processing resources including at least one processor and a memory, and it may be thought of as an event consumer and, for example, may subscribe to streams of interest.

Several components within the SDE server 204 receive the input events. For example, the subset computation and recommendation module 206 included in the SDE server 204 is responsible for determining interesting subsets of the streams, and the continuous regression model computation module 208 is responsible for computing regression models. A subset of a multidimensional stream may be thought of as a selection of stream events fulfilling a filter predicate on the stream attributes. Depending on the type of regression model being used, the models additionally may be compressed, using the model compression component 220 of the continuous regression model computation module 208, e.g., as discussed in greater detail below. The continuous regression model computation module 208 internally uses a CEP engine 210 for model computation and is aided by a stream cache 212 that at least temporarily stores events being processed by the CEP engine 210, intermediate output generated during processing, etc.

The computed regression models are sent from the continuous regression model computation module 208 of the SDE server 204 to the SDE client 214, as well as to the component 216 responsible for maintaining historical regression models which, in the FIG. 2 example, includes a store of historical regression models 218. The store of historical regression models 218 may be backed by a non-transitory computer readable storage medium or the like, e.g., of the SDE server 204.

The SDE client 214 presents the main interface for the user. The client 214 in certain example embodiments includes a configuration panel 222 and a chart renderer component 224. The configuration panel 222 is arranged to enable the user to identify the streams and/or attributes of interest, which settings (e.g., timeframes or windows, baseline comparisons as between the historical model and one or more models, and/or the like) are used for the visualization, which subsets are to be explored, which historical models are to be examined, etc. When the user specifies a stream and an attribute, the client 214 sends those settings to the server 204, which then starts transferring the continuously updated regression models for that attribute to the client 214. In a like manner, the client 214 receives and makes visual the historical regression models the user is interested in, e.g., by retrieving them from the store of historical regression models 218.

In order to "zoom into" or otherwise get more information on the data, the user can either specify a subset or select an interesting subset recommended by the server 204. Once such a subset has been selected, the server 204 starts computing regression models for that subset, as well as for the overall stream. The user may use the interactive chart renderer 224 in this regard.

To facilitate the continuous computation of regression models, the SDE server 204 may maintain an internal registry of input streams to which it is subscribed. The registry may include, for example, information regarding the streams being analyzed, attributes of interest for those streams, queries on those streams, timeframes, create times, TTL values, etc. The stream cache 212 may be used to hold the registry, for example. Using the SDE client 214, the user can specify the streams available on the event bus 202 the user is interested in (e.g., using the configuration panel 222, as indicated above). These streams are then tracked in that registry. A registry entry for a stream may comprises information indicating which users currently investigate that stream, which users have selected which attributes for relationship analysis, which users have which subsets selected for further exploration, and/or the like. The registry information may aid in managing the current computation of regression models, e.g., using the CEP engine 210 in the continuous regression model computation module 208.

The event streams under investigation may quickly change in nature, at least insofar as their characteristics including their attribute relationships can be very volatile. For that reason, SDE server 204 may compute regression models with respect to different window sizes, e.g., 1 minute, 5 minutes, 15 minutes, 1 hour, etc. Having models over different time horizons available may in some instances facilitate the identification of how a timespan is affected by a given change. These windows are called investigation windows. In other words, the continuously computed regression models are available for sliding windows of different sizes, and these sliding windows may be through of as being investigation windows that allow regression models to be compared with different time horizons.

In the SDE client 214, the user can select an attribute of an event stream registered in the stream registry, e.g., using the configuration panel 222. This selection indicates that the user, for this attribute $x_j$ with $1 \leq j \leq n$, wants to investigate how its values depend on the values of the other attributes. Therefore, for each pair ($x_j$, $x_i$ with $i \neq j$), the linear regression model is computed. This model provides a function describing the linear relationship between $x_j$ and $x_i$, where $x_j = ax_i + b$.

Slope a and intercept b specify the regression line. As is known, in a linear regression model, the regression function is linear, and the slope defines how steep that linear function is while the intercept defines where the linear function intersects with the y-axis. An assumption is made that the response variable $x_j$ is a linear function of the predictor variable $x_i$. As is known, in a regression model, the value of the dependent attribute (also called response variable) is a function of one or more independent attributes, and the independent attribute (also called predictor) determines the value of a dependent attribute. Both $x_j$ and $x_i$ are assumed to be random variables. As there typically is not a perfect linear relationship between those random variables, an additional error term, also being a random variable, models the deviations. In the linear regression model, slope and intercept can be determined so that the squared deviation is minimized for a given dataset.

The actual computation of the slope and intercept for a dataset typically will rely on basic statistics such as, for example: the size of the dataset, the sum of $x_j$, the squared sum of $x_i$, the sum of $x_i$, and the sum of products of $x_j$ and $x_i$. See the SQL specification of REGR_SLOPE and REGR_INTERCEPT for an example implementation relating to an example actual computation technique for the slope and intercept using these basic statistics. Certain example embodiments may lack a corresponding static dataset, and streaming data instead may be used. Thus, the regression function may be calculated over a sliding window of events using CEP technology. Because the intercept and slope are simple concepts to compute, they can be computed incrementally while new data is streaming in. In terms of SQL over event streams, the corresponding query for computing intercept and slope over a sliding window of size 5 minutes can be represented as:

SELECT REGR_INTERCEPT($x_i$, $x_j$), REGR_SLOPE($x_i$, $x_j$)
FROM InputStream WINDOW (RANGE 5 MINUTES)

With each new event streaming in, this query returns the intercept and slope of the corresponding last 5 minutes. Internally, the server 204 in certain example embodiments may split that computation up into two queries, with one computing the basic statistics, and a follow-up query deriving the slope and intercept from the basic statistics. Using a separate query for computing the basic statistics and storing them afterwards in the historical regression models store 218 or another model database provides an efficient aggregation of possible historic models, as will be discussed in greater detail below. The basic statistics also can be written as SQL query:

SELECT COUNT(*) AS Size,
    SUM($x_j$) AS Sum_Xj,
    SUM($x_i*x_i$) AS Squared_Sum_Xi,
    SUM($x_i$) AS Sum_Xi,
    SUM($x_i*x_j$) AS Product_Sum_Xi_Xj
FROM InputStream WINDOW (RANGE 5 MINUTES)

Other temporal clauses can be used to determine the intercept and slope for a given time period and/or number of events (e.g., whichever comes first). For example, other temporal clauses can be used to determine the intercept and slope for consecutive windows of 20 minutes (the time axis being partitioned in 20 minute partitions), or the last 100 events. As mentioned above, the server 204 automatically computes the regression function for different window sizes or investigation windows. Thus, if the user selects an attribute to be investigated via the client 214, the server 204 computes the intercept and slope of the regression function with each of the remaining attributes $x_i$, $i \neq j$ over the different investigation windows. Those sliding window queries run continuously and deliver the latest regression functions for the selected attribute and the other attributes. The queries that compute basic statistics and slope/intercept return EDA events as results in certain example embodiments.

FIG. 3 is an example event representation of the basic statistics of a linear regression model that may be produced using the techniques of certain example embodiments. In the FIG. 3 example, the EDA event is in XML, although other example embodiments may use this or another similar language and/or schema. The FIG. 3 example contains the basic statistics of a linear regression model between the response time of an application and the CPU usage. In this regard, start and end times are specified in the header, the model type, stream identifier, response variable, predictor, and statistics themselves are included.

During investigation of an attribute, the user can also define a subset of the stream. In this regard, the user may specify in the SDE client 214 a filter predicate for that attribute. In the SDE server 204, a new continuous query is registered using that filter predicate to filter the incoming events accordingly. As an example, a user may specify that fuel consumption is to be filtered for values between 5 and 7 liters per 100 km in order to investigate low fuel consumption profiles of a car. Another set of continuous queries is registered, and these continuous queries compute the regression functions for the filtered sub-stream and the different investigation windows. Thus, the regression functions over the different investigation windows are computed for the original stream and the filtered sub-stream.

Figure 4:
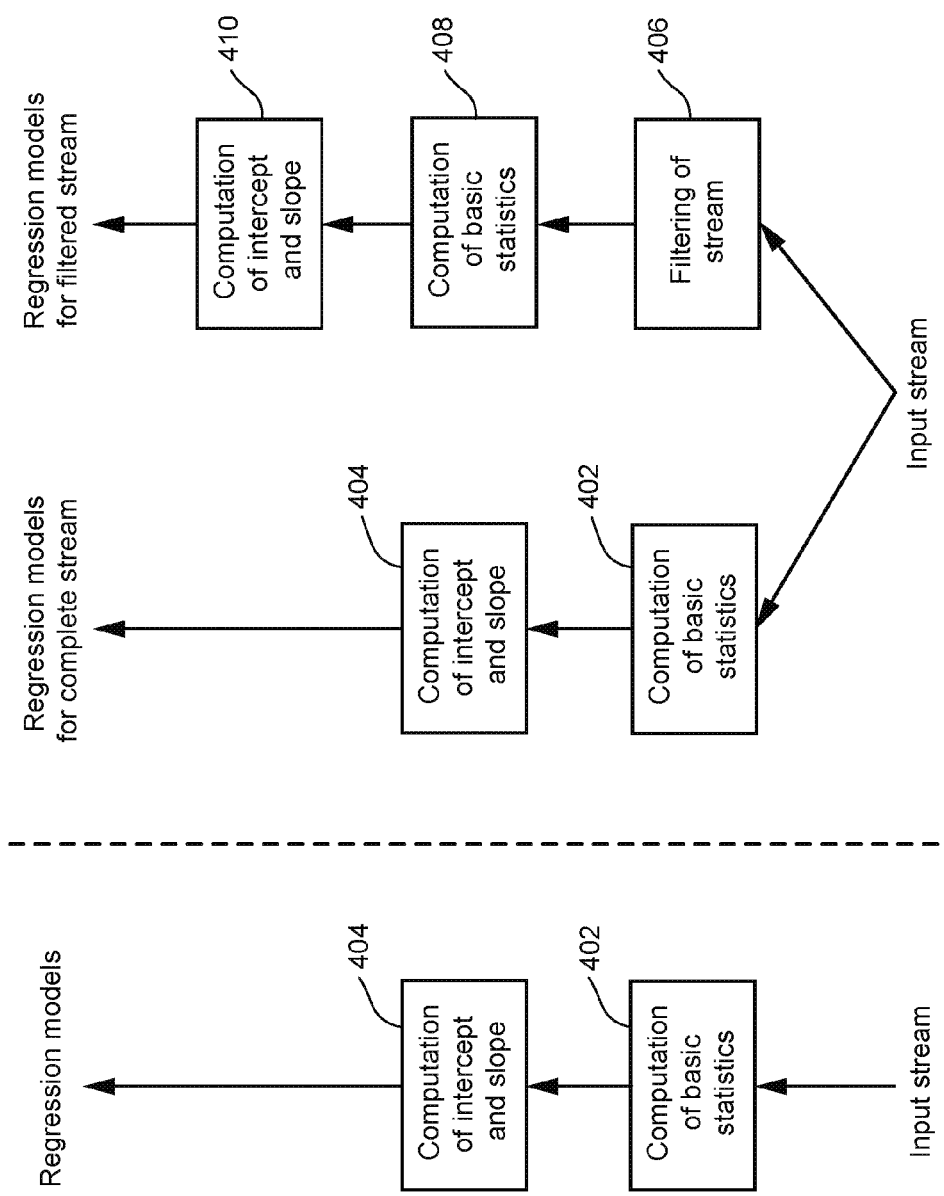
FIG. 4 is a basic computation flow for the computation of regression models for a complete stream (left side), and the complete stream plus the filtered stream (right side), in accordance with certain example embodiments.

FIG. 4 is a basic computation flow for the computation of regression models for a complete stream (left side), and the complete stream plus the filtered stream (right side), in accordance with certain example embodiments. The FIG. 4 example computation flow begins with the receipt of events in the input stream for scenarios involving just the complete stream, and scenarios involving the complete stream plus the filtered stream. Regardless of which scenario it involves, the regression models for the complete stream are produced based on the computation of basic statistics (such as, for example, those described above) in step 402 as indicated above, together with the computation of the intercept and slope for the regression in step 404. Regression models for the complete stream ultimately are produced. In the latter scenario involving the complete stream plus the filtered stream, the filtering of the stream occurs in step 406. Then, the regression model(s) for the filtered stream are produced by computation of basic statistics for the filtered stream in step 408, together with the computation of the intercept and slope for the filtered stream in step 410. Ultimately, regression models for the filtered stream are produced. Although this example computation flow has been defined in connection with regression models involving the preliminary computation of basic statistics and the intercept and slope, it will be appreciated that the above-described and/or other statistics, measures, etc., may be used to calculate factors relevant to the particular model. The invention is not limited to simple linear regression.

It will be appreciated that certain example embodiments may maintain separate information for the models applicable to the sub-streams. It also will be appreciated that certain example embodiments may automatically change the model type when a given model no longer fits a sub-stream, e.g., in a manner similar to that described in connection with the complete stream.

When the user selects an attribute, the SDE client 214 is in essence programmed to infer that the user wants to directly investigate the regression function over the recent past. For that reason, the SDE server 204 may continuously maintain the events for the maximum size of the investigation windows. Once the user selects the attribute, the server 204 uses these events to derive the events belonging to the different investigation windows, e.g. the events of the last minute, 5 minutes, 15 minutes, 1 hour, etc. The server 204 computes the regression functions for these timeframes so that the user can directly start the investigation. Otherwise, the user might be forced to wait the corresponding amount of time (e.g., 5 minutes) until the first regression model is available. With new events streaming in, the regression functions are continuously updated by successively combining these initial events with the new events until the regression functions are finally no longer based on the initial events.

In certain example embodiments, the server 204 by default computes the regression functions for tumbling windows using a predefined window size, sometimes referred to as the storage granularity. The time axis is partitioned into consecutive partitions each having that size (e.g., 15 minutes). The resulting regression functions, as well as information about the corresponding partition, are then sent to the component managing the historic regression models. These historic regression functions allow the user to investigate past behavior of an attribute. The storage granularity thus may be thought of as defining the finest temporal resolution of the available regression models.

As will be appreciated from the above, certain example embodiments have been discussed in connection with the specific case of linear regression models. However, the relationship between $x_j$ and $x_i$, $i \neq j$ will not necessarily always be linear and, therefore, linear regression models may not fit the data. For example, the relationship between the price of a product and the resulting revenue typically is not linear; with an increasing price, the revenue typically also increases in the beginning, but from a certain price threshold on, the revenue will decrease as the product becomes too expensive for the customer and it is bought less. As another example, the relationship between speed and fuel consumption of a car is not linear, as the fuel consumption strongly increases for values greater than optimal speed of the car. Whether a model fits can be tested in different ways. One way is to check whether the correlation coefficient ($R^2$) is close to 1 and/or whether the deviations are normally distributed. Such a check may be executed periodically to determine whether a linear regression model still fits. If a determination is made that a model no longer is a good fit (e.g., the correlation coefficient or other value falling below a predetermined threshold), the system can switch to the computation of other regression models such as, for example, piecewise linear regression models, polynomial regression models, and/or the like.

Similarly, if parametric models do not fit, the system can compute non-parametric regression models. Those models in general do not make specific assumptions on the form of the regression function. Non-parametric models can be based on, for example, kernels or wavelets. The resulting model is a real-valued function. Even though non-parametric regression approaches typically are more robust than parametric regression approaches, they have the drawbacks of requiring large sample sizes and being computationally expensive. For that reason, in certain example embodiments, the SDE server 204 may first start with linear models and only switch to non-parametric methods if necessary or desirable (e.g., the fit being deemed no longer good enough). The computation of non-parametric models typically cannot be expressed as a combination of basic statistics as is the case with linear regression. Thus, it may be difficult to formulate such models in terms of continuous queries using standard SQL. Instead, the computation of these models in certain example embodiments may be implemented as a user-defined aggregation function in a sliding window query. A user-defined aggregation function can access the events in the current time window and execute advanced calculations such as, for example, those useful in deriving a non-parametric regression model based on kernels. Thus, the non-parametric model also may be computable in an online fashion by encapsulating its computation within a user-defined aggregation function that is continuously called while new events are streaming in. Using that approach, certain example embodiments can be extended with further and further regression and/or other analysis techniques.

If the regression model cannot be decomposed into incrementally computable statistics as is the case with linear regression, an additional compression step may be applied. Certain example embodiments receive a real-valued regression function for a specific timeframe. Typically, the memory allocation of that function linearly depends on the size of the underlying dataset. In order to reduce the storage and evaluation costs, such a function is sent to a model compression component 220, which derives a more compact approximation of the function in that it requires less memory and also allows for an efficient evaluation. Different techniques can be used to compress a real-valued function including, for example, application of cubic splines, piecewise linear functions, wavelets, etc. The actual technique being used and the compression rate can be configured by the user in certain example embodiments. For reasons of efficiency, such a compressed regression function also is sent to the client 214 for the visualization instead of the original regression function.

While multiple users examine multiple streams and their attributes, certain example embodiments continuously execute corresponding sliding window queries. In order to avoid unnecessary system load, the certain example embodiments may automatically deregister sliding window queries for event streams that are not currently under investigation, have not been investigated recently, and/or the like. As previously described, this information may be available in the stream registry. In this regard, certain example embodiments may request from that registry all streams not currently being examined and then remove the corresponding sliding window queries. Certain example embodiments only execute that cleanup operation in a periodic manner, if the system load is too high, and/or the like. Thus, the user switching back to a stream that already has been examined can directly access the associated queries, provided that the previous accession was not too long in the past. The further in the past the accession to that stream is, the more likely that the queries for that stream have been deregistered, at least in certain example embodiments. It will be appreciated that this cleanup operation need not affect the queries computing the historic regression models over tumbling windows.

As described above, the SDE server 204 executes a set of continuous queries for each stream marked by the user as relevant. These continuous queries are defined over tumbling windows of a predefined size (e.g., 15 minutes). Thus, the time axis is partitioned into consecutive 15 minute windows, and the regression model is computed for each of those windows. The regression models as, well as the partitions for which they have been computed, are sent to a SDE server 204 and, more particularly, to the historical regression model management component 216 responsible for managing historical regression models. As indicated above, the historical regression model management component 216 may maintain a database or other store 218 that includes historical regression models.

FIG. 5 is a schematic view of the regression model storage and example entries therein, in accordance with certain example embodiments. Assume that linear regression functions are computed. In that case, the slope and intercept of the regression function can be computed using basic statistics of $x_j$ and $x_i$. Given such a regression model, the partition over which it has been computed is stored, e.g., with an indication of the start and end timestamp of that partition. The basic statistics required for computing the slope and intercept of the regression function also are stored. By storing the basic statistics instead of the regression and slope in certain example embodiments, it is possible to derive regression models for different temporal resolutions.

One feature of certain example embodiments relates to enabling the user to view models (including linear regression models) on different resolutions. The computation of regression models on different temporal resolutions may be based on the merge property of the basic statistics used to derive the slope and intercept. Given the basic statistics of two consecutive time partitions, those statistics can be merged to derive the statistics for the combined time partitions. Assume, for example, that there is an ordered sequence of consecutive partitions $p_1, \ldots p_n$ and there also are corresponding basic statistics for each partition. If the user wants to view or otherwise interact with the regression model for the time frame $[t_0, t_1]$, certain example embodiments may determine the subset of partitions $p_i, \ldots, p_j$ so that $[t_0, t_1] = [p_{i,start}, p_{j,end}]$. As indicated above, in certain example embodiments, the historic models are computed for a partitioned time axis, with each partition having the storage granularity as window size. The selection dialogue for $t_0$ and $t_1$ helps ensure that both of them lie in the start/end timestamp of one of those partitions. This helps ensure that $[t_0, t_1] = [p_{i,start}, p_{j,end}]$ holds. Using a divide-and-conquer approach, the basic statistics for different resolutions of $p_i, \ldots, p_j$ can be computed. This approach is schematically illustrated in FIG. 6 for a hypothetical scenario.

Figure 6:
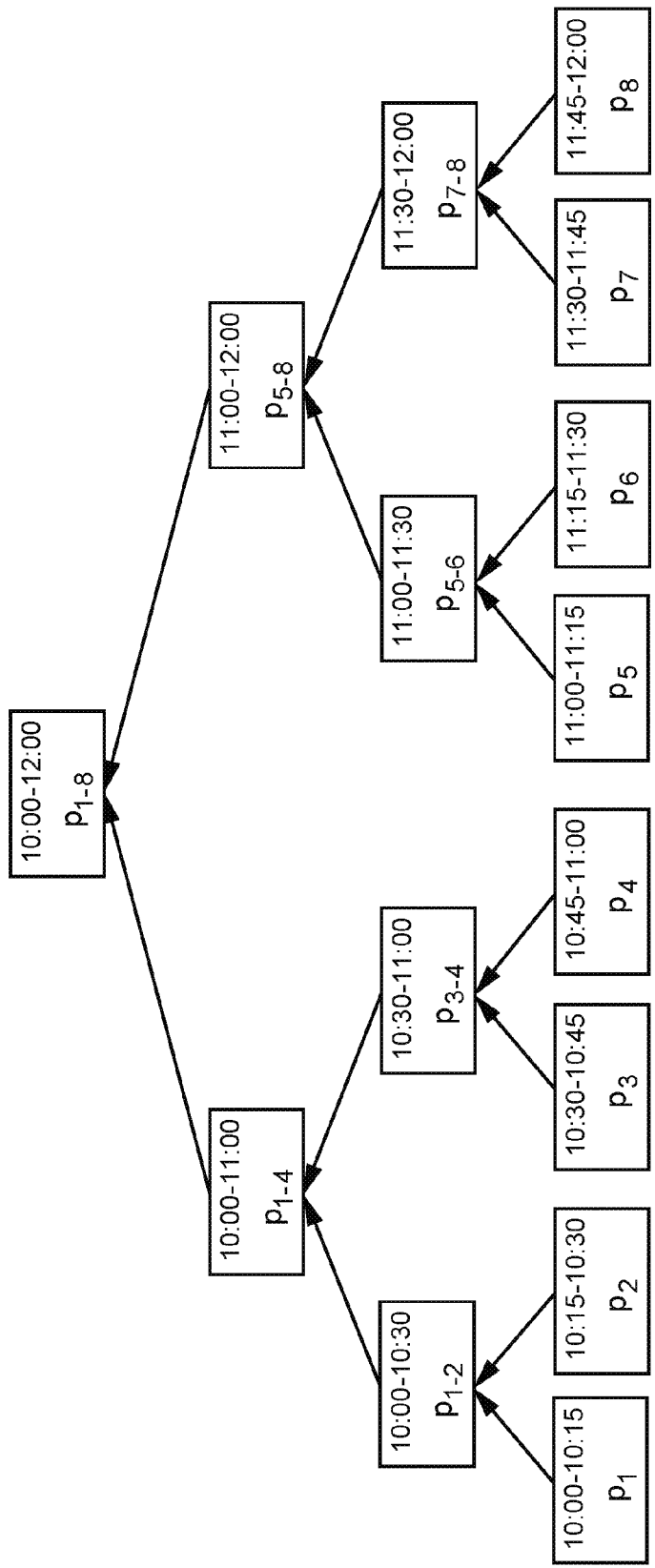
FIG. 6 is a schematic view of a hypothetical roll-up for regression models illustrating a divide-and-conquer approach to calculating statistics for different partitions, in accordance with certain example embodiments.

The basic statistics for the different partitions are successively merged using a roll-up approach such as that shown in FIG. 6. Within each roll-up operation in this example, the timeframe covered by the new partition doubles, finally resulting in one partition covering the combined timeframes of $p_i, \ldots, p_j$. The merge step for two partitions merges the basic statistics required for the computation of the intercept and slope. The first statistic is the size of the dataset. Given $s_k$, the size of partition $p_k$, and $s_{k+1}$, the size of partition $p_{k+1}$, the size of the merged partition is $s_k+s_{k+1}$. In the same manner, the other basic statistics can be merged. Note that it is not necessary to implement these computational operations in certain example embodiments. For instance, because a database may be used to store the basic statistics, corresponding functionality can be expressed in terms of a SQL query using roll-up and drill-down operations. Overall, these successively merged statistics provide the regression models for the timespan $[t_0,t_1]$ in different temporal resolutions, starting from 15 minutes as the finest resolution in this example. The corresponding regression models are then returned as the result.

It will be appreciated that the regression models for coarser time resolutions may be separately computed, e.g., for regression models other than linear regression models, at least in certain example embodiments.

Referring once again to FIG. 2, the subset computation and recommendation module 206 aids in identifying interesting subsets and recommending them to the user as starting point for further analysis. More particularly, this module 206 receives input events and uses them to automatically derive interesting subsets of the attributes. As stream characteristics are often volatile, the relevant subsets are regularly updated so that recent stream behavior is captured correctly.

Different techniques can be applied to derive an interesting subset of event streams, e.g., depending on what is defined as an "interesting" subset. One potentially interesting subset of the stream is the original stream with outliers being removed. Different definitions of outliers exist, together with corresponding techniques for determining them. One common definition defines as outliers all elements in a dataset being more than 1.5 interquartile ranges above the upper quartile or below the lower quartile. Assuming a normal distribution, another simple approach is to mark an element as an outlier if it deviates by more than a certain number of standard deviations (e.g., three standard deviations) from the mean. Other potentially more complex techniques exist for determining outliers, as well. Another interesting subset of the stream may involve a selectable cluster. A clustering algorithm may be applied in order to reveal clusters in the data, among which the user can choose one for further investigation. To quickly visualize the cluster, which may contain many events, the alpha shape or the convex hull of the cluster can be visualized. Other techniques can be applied to define an interesting subset of the stream, for example, sparse subsets, the result set of a skyline query, and/or the like may be used in certain example embodiments.

The different subset selection strategies can be deactivated by the user, e.g., to reduce system load. If the user has selected one of the recommended subsets, a corresponding filter predicate that describes the subset properties is built. Then, a new continuous filter query is automatically started using that filter predicate, and subsequent queries over that filtered stream are started that compute the regression models for the investigation windows.

It will be appreciated from the description above that certain example embodiments can be used to conduct an automatic analysis of the attribute dependencies, and also can be used to support a visual analytics approach. Example implementation details concerning the latter will become clearer given the explanation concerning the SDE client 214 and its functionality, which follows below.

As will be appreciated from the description above, the SDE client 214 comprises a user interface that is arranged to enable the user to investigate dependencies of the event streams. The client interface 214 may be provided via a computer or computer system remote from the SDE server 204 in certain example embodiments. Such a computer or computer system may include processing resources such as, for example, at least one processor and a memory coupled thereto. It also may include a display device, as well as an interface (e.g., a network connection or the like) that facilitates the connection with the SDE server 204. The client 214 may execute an application or display a web interface that provides functionality and structure for the configuration panel 222 and chart renderer 224.

Figure 7:
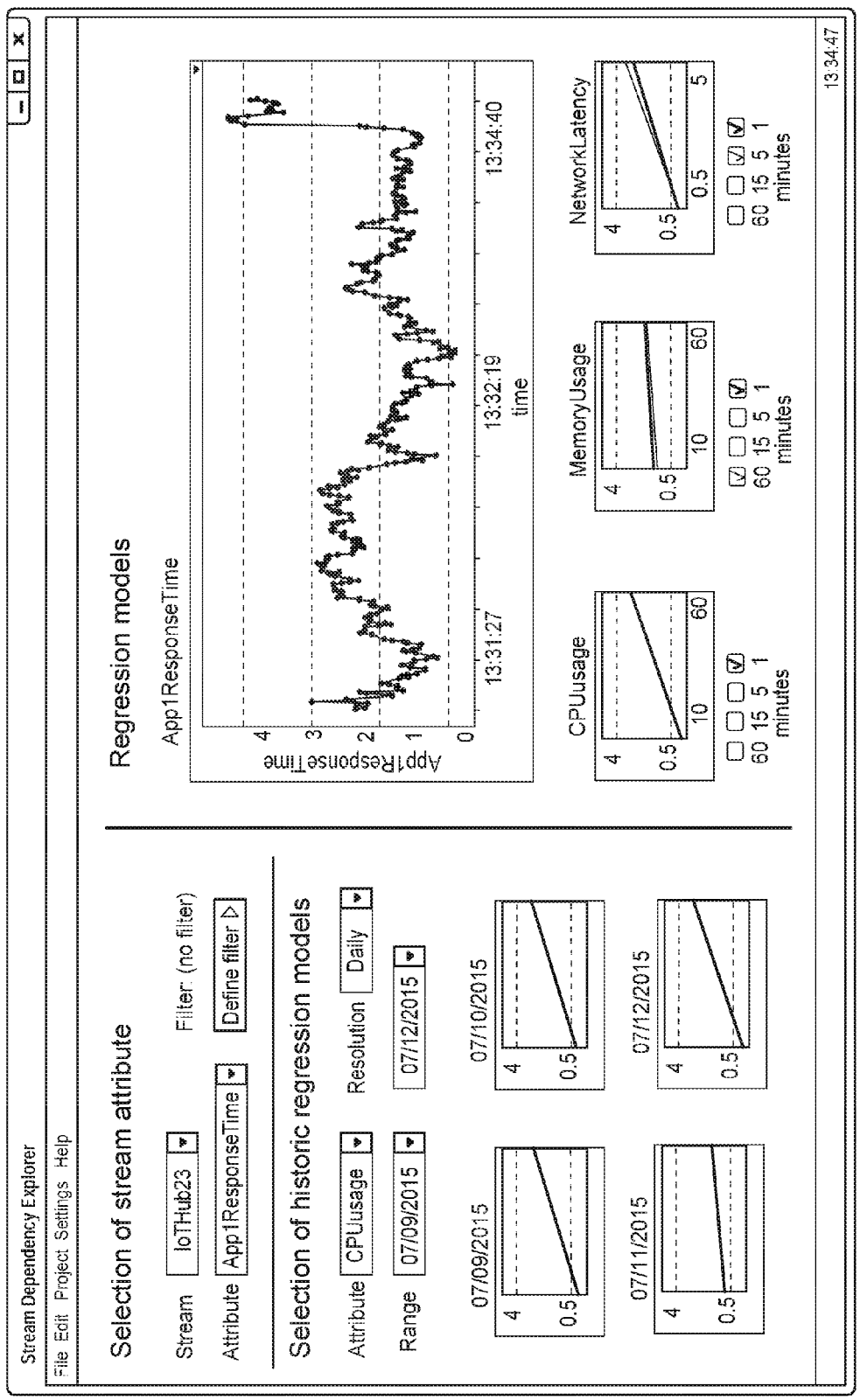
FIG. 7 is a screenshot illustrating an example interface for selecting a stream and investigating regression models, in accordance with certain example embodiments.

FIG. 7 is a screenshot illustrating an example interface for selecting a stream and investigating regression models, in accordance with certain example embodiments. One step when starting an analysis of event streams involves selecting a stream for further investigation. In this regard, the client 214 requests from the stream registry of the server 204 all currently connected event streams. For each of those streams, its associated numeric and/or other attributes are listed. The user selects one of the attributes, e.g., in order to investigate its current values and the dependencies with the other attributes (which also may be numeric in some instances). For the selected attribute, the server 204 starts sending the raw attribute values continuously streaming in, as well as the regression models between the selected attribute and the other attributes.

The raw values and the regression models are fed into the chart renderer component 224. This component 224 renders the raw values and their timestamps into a line chart (or some other chart). Additionally, it renders the regression models into plots or other representations of the regression functions. The rendering of the regression models is kept as simple as possible in some instances in order to help ensure that a quick visual perception of the relationship is possible. As stream characteristics may change quickly, the server 204 computes the regression models for the different investigation windows. Comparing, for instance, the regression model of the last 5 minutes with the model for the last hour may allow the user to understand recent tendencies. The interface also allows the user to select which of the regression models over the different window sizes are to be plotted. For example, a checkbox for each regression model allows the user to selectively display the models in which the user is interested.

The chart renderer 224 works in a push-based manner in certain example embodiments, in that it directly renders new values when they are received. Websocket or other functionality, for example, can be used to facilitate this approach. Depending on the stream rate, however, the update rate on the charts might be too high for the user to visually perceive and derive meaningful information, and/or the chart renderer 224 may have problems dealing with the high number of requests. The chart renderer 224 therefore may in certain example embodiments be configured to apply an additional throttling, e.g., in the event that the processing load is too high, information is arriving too quickly, etc. Different throttling strategies can be applied, e.g., the charts may be refreshed periodically based on the number of events and/or time (e.g., each 100 events, each 500 milliseconds, whichever comes first, etc.).

Thus far, the relationships between attributes of an event stream have been discussed. These are intra-stream relationships. However, as indicated above, the user can also investigate inter-stream relationships. That is, although the dependent variable is from one stream, the independent variables may be from a different stream, and a corresponding regression model may help the user examine the relationships between different streams and compare the behaviors of their attributes.

In many use cases, a user will start with an investigation of the complete stream, and then drill down into subsets of the stream. Given the current plot of the attribute under investigation, the user can select a subset of the attribute values. For example, the user can pick a rectangular region in the chart. This region may be used to define a filter predicate that is then sent to the server and used to configure corresponding queries. Additionally, more complex selections on the event stream can be defined. The client may offer a filter query component, e.g., enabling the user to specify filter criteria. That filter component may enable the filter criteria to be defined programmatically, e.g., using SQL or the like as language. This approach not only allows for filtering with respect to more than one attribute, but also with respect to more than one event stream. For example, a filter query could filter all prices of a stock, when the opening price of a competitive stock is above $73.

In addition to the manual specification of sub-streams, the SDE server 204 also automatically derives a set of interesting subsets. The user can select one of those subsets and then corresponding queries are started in the SDE server 204.

As described above, the server 204 computes regression models for the full stream as well as for the filtered stream. In the visualization, both models are plotted simultaneously. By simultaneously plotting the model for the complete stream and the model for the filtered sub-stream, the user can directly examine how dependency structures in the stream change within a sub-stream. Again, the user can additionally select the generated investigation windows for which the plots are displayed. This also enables the user to compare whether changes in the dependency structures are more recent.

As there are n−1 regression models displayed for a selected attribute, the SDE client 214 also tries to steer the user to the most interesting models. Given the regression model for the complete stream and the model for the filtered stream, the similarity of the two models may be computed by the client 214 and/or the server 204. If they are not similar, the corresponding canvas for these regression models is highlighted. To measure the similarity of two regression models, different methods can be applied. For the case of a linear regression, two models can be marked as different, e.g., if their slopes have different signs. For arbitrary regression models, a similarity measure for real-valued functions can be applied. Then the user can specify a threshold on that similarity measure. When a significant deviation has been detected, certain example embodiments can also be configured to store that fact. When performing an analysis of historic regression models, the user can be directly pointed to the most interesting facts.

The user can also compare the real-time behavior of the event streams with historical behavior. The SDE client 214 has an interface with which the user can access previous regression models. The user specifies a time range for the models the user is interested in, and the server 204 returns the corresponding regression models. As discussed above, for the case of linear regression, the user can roll-up and drill down into the regression models over finer and coarser time resolutions. Within the SDE client 214, the user can examine those historical regression models together with the current model to search for similarities.

The historical model selection is additionally used for replay functionality. In some use cases, the user will not look continuously at a stream and investigate it. Using the replay functionality, the user can specify that there is a desire to see the regression models of the recent past, e.g., of the last two hours. Then, the associated regression models of that timespan are retrieved from the server 204. On the client 214, they are rendered as a video. In that video, the development of the regression model of the selected timeframe is replayed. Using standard video functionality, the user can speed-up/slow-down the video, rewind, pause, etc.

When the user has detected a sub-stream with an interesting behavior, the user can also activate the tracking of that sub-stream. In such a case, the server 204 starts computing the regression models over tumbling windows for that sub-stream, so that the models can be stored in the historical regression model management component 216.

Figure 8:
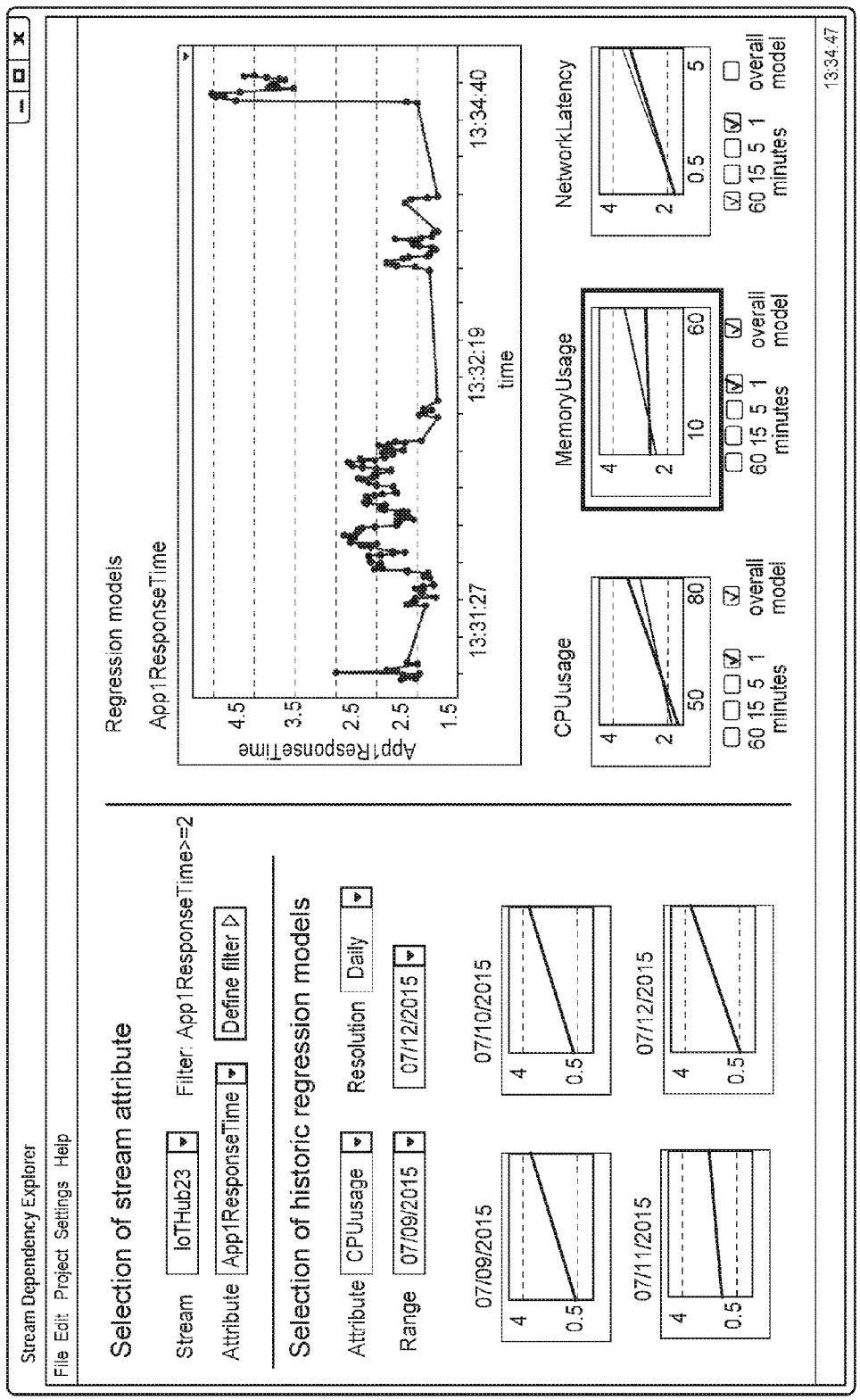
FIG. 8 is a screenshot illustrating how the FIG. 7 example screenshot can be modified for a filtered stream, including the regression models of the complete and filtered streams, in accordance with certain example embodiments.

FIG. 8 is a screenshot illustrating how the FIG. 7 example screenshot can be modified for a filtered stream, including the regression models of the complete and filtered streams, in accordance with certain example embodiments. The user can selectively display the regression model for the complete stream for each attribute. FIG. 7 also illustrates that a significant deviation of the memory usage model in the complete stream and the filtered stream has been detected. The corresponding canvas therefore has been highlighted (i.e., the header MemoryUsage of the corresponding box is highlighted and the transparency of the colored box is reduced).

Although certain example embodiments have been described in connection with regression models based on one dependent and one independent variable, certain example embodiments may allow for multiple regression models, where there is one dependent variable and more than one independent variable. For the case of two independent variables, the corresponding regression model can also be visualized in a three axis coordinate system.

Similarly, certain example embodiments may involve the investigation of non-numeric data. Although certain example embodiments have been described in connection with regression models for numeric data, the example techniques set forth herein can be used to derive regression models for ordinal or nominal data, using corresponding regression techniques for that type of data, e.g., logistic regression, in an analogous manner.

As will be appreciated from the description above, the regression models are computed in an online manner, describing a relationship for a sliding window of past events. Certain example embodiments may, however, forecast a regression model. For example, forecasting can leverage recent events to forecast future events, and a regression model based on those forecasted events can be computed. This forecasted model may illustrate the forecasted relationship between a selected attribute and other attributes.

Even though an event often includes many attributes, in general only a few attributes are really relevant, as they provide the largest amount of information. To point the user to these attributes, techniques for reducing the dimensionality can be applied. These techniques include, for example, Principal Component Analysis and the like. As the stream may change its behavior, such a dimensionality reduction may be applied regularly, e.g., to also help reflect those changes in the attribute subset selection.

The framework of certain example embodiments is flexible and extensible so that other data mining techniques such as, for example, implementation of classification or association rules, can be integrated in a similar manner. The integration and combination of additional technologies may allow for an even more complex visual analysis of streaming data.

Example Scenario/Use Case

The following example scenario illustrates how the SDE of certain example embodiments may be used in practice. This example scenario involves monitoring and analyzing an Internet-of-Things (IoT) Hub.

The data generated as a result of the rapid rise and near ubiquity of smart devices will put huge computational pressures on traditional datacenters and cloud computing platforms. Datacenters capable of handling these new devices and the data they produce are referred to as IoT Hubs. IoT Hubs are capable of handling high-velocity, high-volume datasets originating from traditional web clients, as well as communicating with thousands-to-millions of smart devices and sensors. These IoT Hubs may comprise multiple clusters of compute nodes (like web server pools, API service pools, distributed caches, MicroService pools, search/recommendation engines, Hadoop/Spark clusters, speech recognition engines, Big Data/Analytics/geo-spatial stores, etc.), and may host a multitude of applications and services.

The management of an IoT hub may benefit an interactive, real-time performance monitoring analytics tool capable of analyzing performance metrics and dependencies across other metrics. These performance metrics may be of or include different categories such as, for example: system metrics (e.g., CPU usage, memory usage, socket reads and writes, response times of use cases, disk reads and writes, cache hits and misses, network latency, data center energy usage, etc.); application metrics (e.g., marketing campaign hits, user logins, number of connected users, search queries, voice queries, API queries, log events, exception counts, etc.); infrastructure metrics (e.g., JVM usage, JVM garbage collection count, database response times, map-reduce jobs, database queries, micro service response times, etc.); device metrics (e.g., device type, geo-fence alarms, device alerts, connected devices, device notification data, hardware failure counts, etc.); and/or the like.

A holistic performance analytics tool may aid in analyzing performance, scalability traits, and dependencies across these different metric types. Such intelligence may help in optimizing the IoT computational environment, e.g., in making it better performing and scalable, helping with dynamic re-allocations of resources among applications and services, etc.

Given the existence of multidimensional event streams with different performance metrics, the techniques of certain example embodiments may be used to study metrics dependency structures in the IoT hub. For example, assume that the user selects a "ResponseTime" attribute for a given use case in an effort to reveal its dependency structures within operational metrics. Once selected, the response time value is continuously displayed in a line chart. Regression models are computed for this attribute against all other attributes to reveal their dependency structures. Regression models thus are created for response time vs. CPU usage, response time vs. memory usage, response time vs. disk I/O operations and/or throughput, response time vs. network I/O operations and/or throughput, response time vs. cache hits/misses, and so on.

Regression plots can be studied to discover patterns and performance traits. For example, answers to questions along the following lines can be explored:
Is the response time dominated by CPU or I/O operations?
What is the garbage collection pressure on the response time?
Are Hadoop jobs affecting the performance of a downstream MicroService, which in turn affects the response time?
Are response times consistent across various device clients?
Are large device notifications affecting primary use case response times?

The user can subsequently select other attributes to explore performance metrics data, e.g., to study patterns and uncover hidden knowledge for other metric perspectives. Once another attribute is selected, regression models from its perspective are built continuously. Regression models can be studied to understand, for example, whether certain device types are putting additional pressure on the CPU/JVM heap usage, geo-fence alarms from device hotspots are causing an unusual number of cache misses, peak usages of smartphones and/or tablets are restricted to certain times causing load-pressure on a downstream MicroService, voice queries are causing bandwidth congestion during certain hours, a large number of concurrent map-reduce jobs are spiking datacenter energy usage, etc.

These regression models are continuously computed over different investigation windows.

Illustrating investigations of relevant sub-streams, a filter stream for ResponseTimes>3 seconds, for example, can be defined to drill down into high-latency response times. This can further reveal whether the bottlenecks are caused as a result of compute resource constraints like CPU, memory, network, and/or other limitations, whether they are caused by large bandwidth/computing resources consumed by asynchronous device notifications (e.g., a spike in geo-fence alarms at a specific crowded hotspot) and alerts, whether the number of significant hardware failure rates during that period had an impact, etc.

The SDE server computes interesting subsets and offers them as candidate event streams for further analysis. For example, it could offer subset streams defined by device types, e.g., smartphone stream, tablet stream, beacon stream, etc. It could also offer candidate streams for cache misses, datacenter high energy usage, geo-fence alarms that trigger events when devices go in or out of certain regions, and/or the like.

Example Advantages

Some or all of the following and/or other advantages may be provided by the Stream Dependency Explorer of certain example embodiments, e.g., when it comes to the visual analysis of dependencies in event streams:
Exploration of dependencies in streaming data: The SDE of certain example embodiments allows the user to explore continuously updated regression models of event streams. The application of regression models for investigation windows helps the user to reveal short-term tendencies in attributes dependencies. While investigating sub-streams, the user can compare the attribute dependencies in the subset with the dependencies in the overall stream. These techniques are not limited to analyzing attribute dependencies of one stream, and instead can be leveraged to analyze dependencies of attributes from multiple streams.

Visual comparison with past stream behavior: The SDE of certain example embodiments provides access to previous regression models. The user can request historical models for a specific timeframe, evaluate them on different temporal resolutions, and/or compare them with current stream behavior.

Support for different regression models: The SDE of certain example embodiments is not limited to linear regression models, but also supports the computation of other regression models. The SDE may start with a first model (e.g., a linear regression model), but automatically switch to a more appropriate model, e.g., if the first model does not fit well to the current data. New regression and/or other models can be easily plugged into the system, in certain example embodiments.

Steering through interesting sub-streams: The user is supported during the process of drilling down into the data. The recommendation component derives interesting subsets of the stream that the user can leverage as starting point for further investigations.

Scalable and extensible design: The SDE of certain example embodiments uses CEP technology to cope with potentially high amounts of incoming events. The design of the SDE is flexible so that other techniques can be plugged into the system in an easy manner, e.g., classification algorithms, cluster algorithms, and/or the like may be plugged into certain example embodiments.

Compliance with processing requirements: Good design for visual analysis of streaming data is observed. For instance, the user can interactively explore the data anytime, the views are updated in real time, the changes required after an update are local, the temporal context of the data is preserved, and historical results can be accessed efficiently.

It will be appreciated that as used herein, the terms system, subsystem, service, engine, module, programmed logic circuitry, and the like may be implemented as any suitable combination of software, hardware, firmware, and/or the like. It also will be appreciated that the storage locations, stores, and repositories discussed herein may be any suitable combination of disk drive devices, memory locations, solid state drives, CD-ROMs, DVDs, tape backups, storage area network (SAN) systems, and/or any other appropriate tangible non-transitory computer readable storage medium. Cloud and/or distributed storage (e.g., using file sharing means), for instance, also may be used in certain example embodiments. It also will be appreciated that the techniques described herein may be accomplished by having at least one processor execute instructions that may be tangibly stored on a non-transitory computer readable storage medium.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An information processing system, comprising:
  an interface configured to receive at least one selected stream of events from an event bus that receives a plurality of streams of events from a plurality of different devices, each event in each stream in the plurality of streams having at least one attribute;
  a model store, backed by a non-transitory computer readable storage medium; and
  processing resources including at least one processor and a memory coupled thereto, the processing resources being configured to at least:
    receive first user input identifying the at least one selected stream;
    receive second user input identifying at least two attributes of interest, the attributes of interest being selected from the attributes of the events in the at least one selected stream;
    execute a continuous query on the at least one selected stream to attempt to, directly or indirectly, mathematically compute a statistical model including the at least two identified attributes of interest, the statistical model having a type;
    store a representation of the mathematically computed statistical model to the model store;
    generate for output to the user a user-interactive display including a representation of the mathematically computed statistical model, the user-interactive display being dynamically changeable based upon at least (a) an update to the mathematically computed statistical model that results from the execution of the continuous query, and (b) receipt of third user input that identifies a sub-stream of the at least one selected stream;
    determine whether the mathematically computed statistical model sufficiently fits for the at least two identified attributes of interest;
    in response to a determination that the mathematically computed statistical model does not fit for the at least two identified attributes of interest, change the type of the statistical model to a new type so that the new type of statistical model better fits for the at least two identified attributes of interest; and
    receive user input indicative of a replay request and a past time period associated with the replay request.

2. The system of claim 1, wherein the statistical model at least initially is a linear regression model.

3. The system of claim 2, wherein the new type of statistical model is a non-linear regression model.

4. The system of claim 1, wherein the determination of whether the mathematically computed statistical model sufficiently fits for the at least two identified attributes of interest is based on a comparison of the correlation coefficient for the mathematically computed statistical model with a predefined threshold.

5. The system of claim 1, wherein the processing resources are further configured to at least store the representation of the mathematically computed statistical model to the model store at a predetermined interval and/or upon an occurrence of a predetermined event that has been automatically detected by the processing resources.

6. The system of claim 1, wherein the processing resources are further configured to at least:
  retrieve a historical model from the model store in response to a user selection, the retrieved historical model having an associated original temporal resolution; and apply the retrieved historical model with respect to the at least two identified attributes of interest at a temporal resolution that differs from the original temporal resolution associated with the retrieved historical model.

7. The system of claim 1, wherein the processing resources are further configured to at least:
retrieve a historical model from the model store in response to a user selection, the retrieved historical model having an associated original temporal resolution; and
apply the retrieved historical model against data currently streaming in from the at least one selected stream.

8. The system of claim 1, wherein the first user input identifies a plurality of selected streams.

9. The system of claim 8, wherein the second user input identifies at least first and second attributes of interest, the first attribute of interest being selected from the attributes of the events in one of the plurality of selected streams and the second attribute of interest being selected from the attributes of the events in another one of the plurality of selected streams.

10. The system of claim 1, wherein the user-interactive display further includes a dynamically updatable visual representation of a relationship between one or more of the at least two identified attributes of interest and at least one other, different attribute of the events in the at least one selected stream.

11. The system of claim 10, wherein the processing resources are further configured to at least:
automatically detect whether a highly correlated relationship exists between one or more of the at least two identified attributes of interest and each of the other, different attribute of the events in the at least one selected stream; and
cause the user-interactive display to highlight each automatically detected highly correlated relationship.

12. The system of claim 1, wherein the processing resources are further configured to at least:
automatically detect sub-streams of the at least one selected stream of potential interest; and
enable the user to view such automatically detected sub-streams.

13. The system of claim 1, wherein the processing resources are further configured to at least execute the continuous query, or a different continuous query, on a selected sub-stream to attempt to, directly or indirectly, mathematically compute another statistical model including the at least two identified attributes of interest within the selected sub-stream.

14. The system of claim 1, wherein the processing resources are further configured to at least:
retrieve one or more historical models from the model store in response to the receipt of the user input indicative of the replay request, the one or more retrieved historical models having been mathematically computed in a time period that accords with the past time period associated with the replay request; and
generate for output a replay visually demonstrating how the one or more retrieved historical models developed over the past time period associated with the replay request.

15. An non-transitory computer readable storage medium including instructions that, when executed by at least one hardware processor of a computer system, performs functionality comprising:
using processing resources including at least one processor and a memory,
receiving, over an electronic interface to an event bus that receives a plurality of streams of events from a plurality of different devices, at least one selected stream of events, each event in each stream in the plurality of streams having at least one attribute;
receiving first user input identifying the at least one selected stream;
receiving second user input identifying at least two attributes of interest, the attributes of interest being selected from the attributes of the events in the at least one selected stream;
executing a continuous query on the at least one selected stream to attempt to, directly or indirectly, mathematically compute a statistical model including the at least two identified attributes of interest, the statistical model having a type;
storing a representation of the mathematically computed statistical model to a model store that is backed by a non-transitory computer readable storage medium;
generating, for output to the user, a user-interactive display including a representation of the mathematically computed statistical model, the user-interactive display being dynamically changeable based upon at least (a) an update to the mathematically computed statistical model that results from the execution of the continuous query, and (b) receipt of third user input that identifies a sub-stream of the at least one selected stream;
determining whether the mathematically computed statistical model sufficiently fits for the at least two identified attributes of interest;
in response to a determination that the mathematically computed statistical model does not fit for the at least two identified attributes of interest, changing the type of the statistical model to a new type so that the new type of statistical model better fits for the at least two identified attributes of interest; and
receive user input indicative of a replay request and a past time period associated with the replay request.

16. The non-transitory computer readable storage medium of claim 15, wherein the determination of whether the mathematically computed statistical model sufficiently fits for the at least two identified attributes of interest is based on a comparison of the correlation coefficient for the mathematically computed statistical model with a predefined threshold.

17. The non-transitory computer readable storage medium of claim 15, wherein the representation of the mathematically computed statistical model is stored to the model store at a predetermined interval and/or upon an occurrence of a predetermined event that has been automatically detected by the processing resources.

18. The non-transitory computer readable storage medium of claim 15, wherein further instructions are executable to at least:
retrieve a historical model from the model store in response to a user selection, the retrieved historical model having an associated original temporal resolution; and
apply the retrieved historical model (a) with respect to the at least two identified attributes of interest at a temporal resolution that differs from the original temporal resolution associated with the retrieved historical model and/or (b) against data currently streaming in from the at least one selected stream.

19. The non-transitory computer readable storage medium of claim 15, wherein the second user input identifies at least first and second attributes of interest, the first attribute of interest being selected from the attributes of the events in one of a plurality of selected streams and the second attribute of interest being selected from the attributes of the events in another one of the plurality of selected streams.

20. The non-transitory computer readable storage medium of claim 15, wherein the user-interactive display further includes a dynamically updatable visual representation of a relationship between one or more of the at least two identified attributes of interest and at least one other, different attribute of the events in the at least one selected stream.

21. The non-transitory computer readable storage medium of claim 20, wherein further instructions are executable to at least:
automatically detect whether a highly correlated relationship exists between one or more of the at least two identified attributes of interest and each of the other, different attribute of the events in the at least one selected stream; and
cause the user-interactive display to highlight each automatically detected highly correlated relationship.

22. The non-transitory computer readable storage medium of claim 15, wherein further instructions are executable to at least:
automatically detect sub-streams of the at least one selected stream of potential interest; and
enable the user to view such automatically detected sub-streams.

23. The non-transitory computer readable storage medium of claim 15, wherein further instructions are executable to at least execute the continuous query, or a different continuous query, on a selected sub-stream to attempt to, directly or indirectly, mathematically compute another statistical model including the at least two identified attributes of interest within the selected sub-stream.

24. The non-transitory computer readable storage medium of claim 15, wherein further instructions are executable to at least:
retrieve one or more historical models from the model store in response to the receipt of the user input indicative of the replay request, the one or more retrieved historical models having been mathematically computed in a time period that accords with the past time period associated with the replay request; and
generate for output a replay visually demonstrating how the one or more retrieved historical models developed over the past time period associated with the replay request.

25. An information processing method, comprising:
using processing resources including at least one processor and a memory,
receiving, over an electronic interface to an event bus that receives a plurality of streams of events from a plurality of different devices, at least one selected stream of events, each event in each stream in the plurality of streams having at least one attribute;
receiving first user input identifying the at least one selected stream;
receiving second user input identifying at least two attributes of interest, the attributes of interest being selected from the attributes of the events in the at least one selected stream;
executing a continuous query on the at least one selected stream to attempt to, directly or indirectly, mathematically compute a statistical model for the at least two identified attributes of interest, the statistical model having a type;
storing a representation of the mathematically computed statistical model to a model store that is backed by a non-transitory computer readable storage medium;
generating, for output to the user, a user-interactive display including a representation of the mathematically computed statistical model, the user-interactive display being dynamically changeable based upon at least (a) an update to the mathematically computed statistical model that results from the execution of the continuous query, and (b) receipt of third user input that identifies a sub-stream of the at least one selected stream;
determining whether the mathematically computed statistical model sufficiently fits for the at least two identified attributes of interest;
in response to a determination that the mathematically computed statistical model does not fit for the at least two identified attributes of interest, automatically changing the type of the statistical model to a new type so that the new type of statistical model better fits for the at least two identified attributes of interest; and
receiving user input indicative of a replay request and a past time period associated with the replay request.

26. The method of claim 25, further comprising:
retrieving a historical model from the model store in response to a user selection, the retrieved historical model having an associated original temporal resolution; and
applying the retrieved historical model (a) with respect to the at least two identified attributes of interest at a temporal resolution that differs from the original temporal resolution associated with the retrieved historical model and/or (b) against data currently streaming in from the at least one selected stream.

27. The method of claim 25, wherein the second user input identifies at least first and second attributes of interest, the first attribute of interest being selected from the attributes of the events in one of a plurality of selected streams and the second attribute of interest being selected from the attributes of the events in another one of the plurality of selected streams.

28. The method of claim 25, wherein the user-interactive display further includes a dynamically updatable visual representation of a relationship between one or more of the at least two identified attributes of interest and at least one other, different attribute of the events in the at least one selected stream and/or across different streams.

29. The method of claim 25, further comprising:
automatically detecting sub-streams of the at least one selected stream of potential interest;
enabling the user to view such automatically detected sub-streams; and
executing the continuous query, or a different continuous query, on a selected sub-stream to attempt to, directly or indirectly, mathematically compute another statistical model including the at least two identified attributes of interest within the selected sub-stream.

30. The method of claim 25, further comprising:
retrieving one or more historical models from the model store in response to the receipt of the user input indicative of the replay request, the one or more retrieved historical models having been mathematically computed in a time period that accords with the past time period associated with the replay request; and
generating for output a replay visually demonstrating how the one or more retrieved historical models developed over the past time period associated with the replay request.

* * * * *